United States Patent [19]

Edelstein et al.

[11] Patent Number: 4,706,025

[45] Date of Patent: * Nov. 10, 1987

[54] METHODS OF PRODUCING IMAGE FORMATION FROM OBJECTS

[75] Inventors: William A. Edelstein, Schenectady, N.Y.; James M. S. Hutchison; Glyn Johnson, both of Aberdeen, Scotland; Thomas W. T. Redpath, Kincardineshire, Scotland; John R. Mallard, Aberdeen, Scotland

[73] Assignee: National Research Development Corporation, London, England

[ * ] Notice: The portion of the term of this patent subsequent to Mar. 19, 2002 has been disclaimed.

[21] Appl. No.: 879,419

[22] Filed: Jun. 27, 1986

Related U.S. Application Data

[63] Continuation of Ser. No. 702,126, Feb. 15, 1985, Pat. No. 4,602,214, which is a continuation of Ser. No. 320,953, Nov. 9, 1981, Pat. No. 4,506,222.

[30] Foreign Application Priority Data

Mar. 13, 1981 [WO] PCT Int'l Appl. .................. PCT/GB81/00044

[51] Int. Cl.[4] ............................................. G01R 33/20
[52] U.S. Cl. ...................................... 324/309; 324/311
[58] Field of Search ............... 324/309, 307, 311, 313, 324/314

[56] References Cited

U.S. PATENT DOCUMENTS 4,506,222  3/1985  Edelstein et al. .................. 324/309
4,602,214  7/1986  Edelstein et al. .................. 324/309

OTHER PUBLICATIONS

Lai et al., "Nuclear Magnetic Resonance Zeugmatography for Medical Imaging", Electro/78 Conference Record (1978) pp. 1–15.

Primary Examiner—Stewart J. Levy
Assistant Examiner—Kevin D. O'Shea
Attorney, Agent, or Firm—Cushman, Darby & Cushman

[57] ABSTRACT

To produce image information from an object it is subjected to a continuous static magnetic field along a Z axis and to sets of sequences of orthogonal gradients $G_x$, $G_y$ and $G_z$ to the magnetic field. Spins in a selected plane (the X-Z plane) are excited by selective rf pulses and an associated $G_y$ gradient and the selected spins are subjected to all three gradients of which the $G_z$ gradient provides twist or warp to each column of spins extending along the Z axis to phase-encode the columns. The spin-echo signals are read out in the presence of a $G_x$ gradient. In each set of sequences a different value of Z gradient is employed. The Fourier transformed spin-echo signals obtained from each sequence, when arranged in order of increasing $G_z$ gradient and subjected to a second Fourier transform represent the distribution of spin density in the Z direction, thus giving a two-dimensional image of the selected X-Z plane.

1 Claim, 1 Drawing Figure

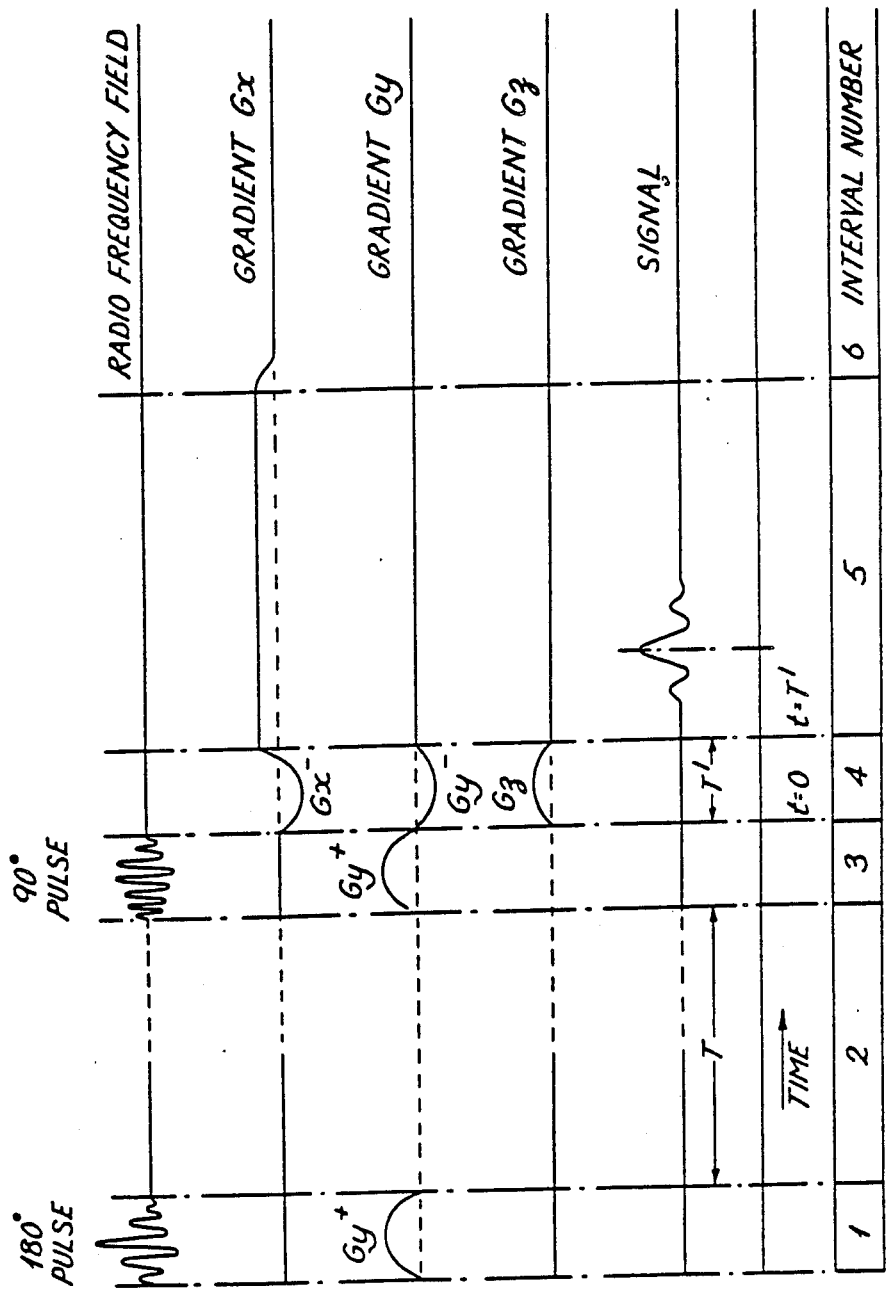

METHODS OF PRODUCING IMAGE FORMATION FROM OBJECTS

This is a continuation of application Ser. No. 702,126, filed Feb. 15, 1985, now U.S. Pat. No. 4,602,214 issued July 22, 1986, which was a continuation of Ser. No. 320,953, filed Nov. 9, 1981, now U.S. Pat. No. 4,506,222.

The present invention relates to methods of producing image information from objects. It is concerned with producing images of samples containing nuclear or other spins whose spatial distribution of density or relaxation time is detected by magnetic resonance techniques. More particularly, it describes methods for producing images from free induction decays (FID's) and spin echoes of the sample in the presence of static magnetic fields and switched magnetic field gradients.

In U.S. Pat. No. 4,070,611 there is described a method of producing images by a series of FID's following separate excitations of the sample. During these FID's, magnetic fields in two (or three) orthogonal directions are switched on and off for specific lengths of time to yield two (or three) dimensional images.

One of the problems associated with the above method is that inhomogeneities of the static magnetic field can simulate the effect of the deliberately introduced switched field gradients and mask the effect of these switched field gradients, thereby destroying some of the information contained in the signal.

The masking effect can occur as follows. Different FID's have field gradients of fixed strength switched on for varying times. For any particular combination of gradient pulse lengths during a single FID, spins in different regions of the sample experience varying phase shifts relative to each other.

These phase shifts allow spatial discrimination and therefore enable an image to be formed. The amount of phase shift between two regions of the sample is proportional to the difference in local magnetic field of the two regions. If inhomogeneities in the static magnetic field contribute to the local field (in addition to deliberately introduced gradients), the spatial distribution information can be distorted.

Suppose for example that in one of the FID's needed to produce an image, the gradient $G_z$ in the z direction is switched on for time T. Consider a small volume element of a sample at $Z=Z_o$. It experiences a field $B(Z)=B_o+Z_oG_z+\Delta B(Z_o)$, where $B_o$ is the static magnetic field at $Z=0$ and $\Delta B(Z_o)$ is the deviation from the static field at $Z_o$ due to the inhomogeneity in the static field. Then at the end of time T the spins at $Z=Z_o$ experience a change in phase $\Delta\phi$ relative to spins at $Z=0$ given by $$\Delta\phi=\gamma(Z_oG_z+\Delta B(Z_o))T \qquad (1)$$

where $\gamma$ is the gyromagnetic ratio. So effectively the gradient appears to be not $G_z$ but $G_z+\Delta B(Z_o)/Z_o$. A Fourier transform along the Z direction will yield a distorted and non-linear scale in that direction. Moreover, the extra phase shifts could cause signals from some parts of the sample to appear incorrectly in the wrong part of the image (aliasing).

A numerical example will illustrate the seriousness of this problem.

In order to produce a well-determined $N\times N$ image, it is necessary to take N samples from N signals. For whole-body imaging, one would require a region at least 40 cm in diameter and produce a $64\times64$ element image.

Referring to equation (1), there need to be 64 different values of $\Delta\phi$. These are obtained by having 64 different values of time during which the gradient $G_z$ is applied. Ignoring the $\Delta B$ term in equation (1) for the moment, an example of such a series is given by $$\Delta\phi_1=0$$

$$\Delta\phi_2=\Delta\phi^*=(\gamma Z_oG_z)(T)$$

$$\Delta\phi_3=2\Delta\phi^*=(\gamma Z_oG_z)(2T)$$

$$\Delta\phi_4=3\Delta\phi^*=(\gamma Z_oG_z)(3T)$$

$$\Delta\phi_N=(N-1)\Delta\phi^*=(\gamma Z_oG_z)[(N-1)T]$$

Note that the stength of the gradient is the same for each $\Delta\phi_k$ but the time gradients are applied varies. There is a condition, however, that $\Delta\phi^*<2\pi$ across the sample. Using reasonable parameters based on a whole-body nuclear magnetic resonance imaging reference, the length of the sample can be set to L=40 cm, T=0.5 ms, $\gamma/2\pi=4260$ Hz/Gauss, and the condition $\Delta\phi^*<2\pi$ gives Gz<0.012 Gauss/cm. At 20 cm, the maximum distance from the centre of the field, $G_z\times Z=0.24$ Gauss. But the inhomogeneity in a four coil, eighth order resistive magnet (which is typical of those used for whole-body imaging) will be about $10^{-4}$ at 20 cm, or 0.1 Gauss for a 1 kGauss magnet, nearly half the contribution of the gradient. This situation is unacceptable since one is trying to resolve those 20 cm into 32 parts, and the distortion introduced by such inhomogeneity would ruin the image making process.

Looked at in a slightly different way, the above difficulty imposes a stringent condition on the homogeneity of the static magnetic field.

The principal object of the present invention is to provide an improved method of gyromagnetic resonance imaging employing trains of free induction decays.

According to the present invention a method of deriving image information from an object using nuclear magnetic resonance signals comprises subjecting an object to a continuous static magnetic field along one axis and repeatedly carrying out a set of sequential steps each set of steps comprising:

(1) selectively exciting nuclear spins in a plane in the presence of a first gradient of the magnetic field which has a gradient direction perpendicular to said plane;

(2) reversing the direction of the said first gradient and applying a second gradient and a third gradient of the magnetic field, the direction of the second gradient being orthogonal to the gradient direction of the first gradient, and the third gradient having a gradient direction orthogonal to the gradient directions of both the first and second gradients;

(3) reversing the direction of the second gradient of the magnetic field and holding the said reversed gradient while reading out the resultant free induction decay signal from the said object; and then successively repeating the above set of steps with different values of time integral of the third gradient, there being a recovery interval between the repetition of successive sets of steps.

Preferably the period of application of the said third gradient of the magnetic field is equal in each of the sets of steps.

In carrying out the invention it may be convenient to apply the first, second and third gradients of the magnetic field in step (2) simultaneously.

In order that the invention may be more fully understood reference will now be made to the accompanying drawings in which the single FIGURE shows pulse sequences for an embodiment of the invention.

For the purpose of the following description a static magnetic field $B_o$ lies along the Z axis and the radiofrequency (rf) field lies along the Y axis. There are coils to produce gradients $G_x$, $G_y$ and $G_z$ to the magnetic field $B_o$ in the X,Y and Z directions. The production of a two-dimensional image of a thin slab perpendicular to the Y axis is considered. Where the method is applied to human whole body imaging it is convenient to position the patient horizontally with the Z direction vertical and the Y direction horizontal along the length of the patient. The X direction is then horizontal across the patient.

The pulse sequence used to form an image from single spin echoes following separate excitations is shown in FIG. 1. The time axis is divided into six successive intervals repeated cyclically. The fields which are applied in each of these intervals are as follows:

INTERVAL 1

A 180° rf pulse is applied simultaneously with a magnetic field gradient $G_y^+$. This selectively inverts the nuclear spins in and close to the plane $Y=Y_o$. The value of $Y_o$ can be altered by a change in the frequency of the 180° pulse. Alternatively, a non-selective 180° pulse can be applied with no gradients present. Yet again non-selective spin inversion can be obtained by an adiabatic fast passage in which the rf field is swept through a frequency range. y-dimension selection is then done entirely by the events in interval 3.

INTERVAL 2

The nuclear spin system is allowed to relax by spin-lattice relaxation for a chosen time T. No fields other than $B_o$ are applied during this interval.

INTERVAL 3

A weak 90° rf pulse is applied simultaneously with a magnetic field gradient $G_y^+$. This selectively excites nuclear spins in and close to the plane $Y=Y_o$. The value of $Y_o$ can be altered by a change in the frequency of the 90° pulse.

INTERVAL 4

A gradient of the magnetic field having a negative value $G_y^-$ is applied to rephase the selected nuclear spins along the Y direction. Simultaneously a negative gradient $G_x^-$ to the magnetic field is applied to dephase the nuclear spins along the X direction. Simultaneously a gradient $G_z$ of the magnetic field is applied to dephase the spins along Z.

INTERVAL 5

A smaller positive magnetic field gradient $G_x^+$ is applied. During this interval, the nuclear spins rephase to form a spin echo, when the free induction signal is a maximum, and then dephase. It is desirable to keep $G_x^+$ constant during this interval, at which time the nuclear free induction signal is collected.

INTERVAL 6

System recovery time until the occurrence of interval 1 of the next sequence. This should be long compared with the spin-lattice relaxation time T and may be of the order of a second in a whole-body imaging apparatus.

The various gradients of the magnetic field described above need not have a square wave time profile but can have a sinusoidal profile of amplitude against time, which makes less demand on the switching circuits for the gradient coils.

Two different kinds of free induction signals, $S_A$ and $S_B$ are obtained using this pulse sequence, for any one value of the altered high frequency of interval 1 or interval 3 and any one value of $\int_4 dt\, G_z$ in interval 4, where $\int_4 dt$ indicates the integral over interval 4.

$S_B$: The relaxation interval (2) is comparable with the spin-lattice relaxation time being measured. That is, $T \approx K_1$, which is a few hundred milliseconds for human soft tissue at 1.7 MHz.

$S_A$: The events of intervals 1 and 2 are omitted, but the rest of the sequence is identical.

$S_A$ contains mainly proton density information, and $S_B$ contains both spin-lattice relaxation time ($T_1$) information and proton density information.

It may be desirable to consider the events in interval 4 in more detail. In that interval all three orthogonal magnetic field gradients are applied simultaneously. At firt sight this would appear to make analysis of the spin behaviour rather difficult but since no radio frequency field is present in interval 4 the effects of the three gradients can be considered separately. The resultant effect of the three gradients although applied simultaneously is the same as if they were applied sequentially and the coincidence in timing is simply a convenience which serves to save time between excitation and signal acquisition in interval 5. The $G_y^-$ gradient serves to rephase the spins across the width of the selected slice and thus it maximises the signal that is eventually obtained. THe $G_x^-$ gradient serves to dephase the spins along the X direction as a preliminary to the readout step in interval 5 in which a $G_x^+$ gradient is applied to cause the spins to rephase and produce a kind of gradient-induced spin echo in the middle of the signal acquisition period. The Fourier transform of this spin echo signal is therefore a one-dimensional projection of the spin density within the slice on to the X axis.

The function of the gradient $G_z$ is to provide discrimination in the Z direction. It is introduced in interval 4 to give a known amount of twist or "warp" to each vertical column of spins (Z axis vertical), and thus it phase encodes the signal prior to projection on to the X axis. In fact it maximises the response to a particular vertical spatial frequency in the column equal to the spatial frequency of the "warp".

The entire set of steps described above is successively repeated a number of times and in each repetition a different amplitude of gradient $G_z$ is utilised to cover a range of vertical spatial frequencies from zero up to a maximum. Now suppose that the projected spin density values for any one column (obtained from the Fourier transforms of the spin-echo signals) are arranged in order of increasing $G_z$ pulse size, and subjected to another Fourier transform, then this will represent the distribution of spin density up the column. When this is done for each column a complete two-dimensional image of the selected slice is obtained. Thus, an $N \times N$ image can be obtained by taking N projections on to the same axis, a procedure which is obviously impossible in X-ray or radio-isotope imaging, simply because the basic signal has no phase information in it.

Another view of the action of the phase-encoding gradient $G_z$ is that in each imaging column N projections are collected onto the X axis. The projections are different because spins at different heights are given varying amounts of phase twist by the presence of different values of $G_z$ (hence the name "spin warp").

The phase information in an NMR signal is preserved by employing two phase-sensitive detectors in quadrature to produce two signals which are then treated as a single complex number. The outcome of the double Fourier transformation is a matrix of complex numbers whose amplitudes represent the required spin densities. Their phases would ideally be identical in a perfect magnetic field; in practice they may vary considerably by many cycles over the image plane, representing as they do the primary effect of main magnetic field inhomogeneity. This is of no consequence, however, since the phase information is abandoned at this stage of the processing.

In order to derive an N×N proton density image, N samples from each of N $S_A$ signals must be collected. The N signals have N different distributions of the phase shift along Z and hence N different values of $\int_4 dt\, G_z$. For this purpose a series of waveforms for $G_z$, namely $G_{z0}, G_{z1}, \ldots, G_{z(N-1)}$ are utilised such that, for example $$G_{z0} = 0$$

$$\int_4 dt\, G_{z2} = 2 \int_4 dt\, G_{z1} = 2G^*$$

$$\int_4 dt\, G_{z3} = 3 \int_4 dt\, G_{z1} = 3G^*$$

$$\int_4 dt\, G_{z(N-1)} = (N-1) \int_4 dt\, G_{z1} = (N-1)G^*$$

where $G^* = \int_4 dt\, G_{z1}$.

In other words, the Z gradient is always applied for the same period of time but changes in strength for different pulse sequences. In fact in each successive sequence $G_z$ has the same shape and length but its amplitude changes by equal steps from zero to a maximum value. There is a maximum condition on the series, namely that if the total length of the sample in the Z direction is $L_z$, then $\gamma L_z G < 2\pi$. If this limit is exceeded, aliasing will occur, and some parts of the sample may contribute to more than one region of the image.

The image is finally obtained by applying a two-dimensional Fourier transformation to the N echo signals consisting of N samples each. If the signals are designated as $f_m(\tau n)$, where $\tau n$ are the sampling times and m and n go from 1 to N, an example of such a transformation is given by $$P(I,J) = \frac{1}{N} \sum_{m=1}^{N} \exp\left[-jm\gamma G^* L_z\left(\frac{2I-N}{2N}\right)\right] \times \sum_{n=1}^{N} \exp\left[-jn\gamma G_x L_x\left(\frac{2J-N}{2N}\right)\right] f_m(\tau n) \quad (3)$$

where $L_x$ is the length of the sample in the X direction, $L_z$ is the length of the sample in the Z direction, $P(I,J)$ is the image element at co-ordinate $(I,J)$, and I and J each go from 1 to N.

An image containing mostly $T_1$ information can be obtained by collecting N $S_B$ signals along with N $S_A$ signals, deriving an $S_A$ image array and an $S_B$ image array as outlined above, and calculating the $T_1$ values (from these arrays) corresponding to each imaging element. An image containing a mixture of $T_1$ information and proton density information can be obtained from a collection of N $S_B$ signals alone.

The method described above lessens the effect of inhomogeneities in the static magnetic field. The effect of an inhomogeneous static field as in equation (1) can be included thus $$\Delta\phi = \gamma Z_o \int_4 dt\, G_z + \gamma \Delta B(Z_o) T' \quad (4)$$

$\Delta B(Z_o)$ is the difference between the static field value at $Z_o$ and the nominal static field value, and $T'$ is the duration of interval 4. This difference is due to inhomogeneities in the static field. Equation (4) shows that there is extra phase shift caused by the inhomogeneity, but the extra phase shift is the same for all pulse sequences because $T'$ is the same for all pulse sequences. This extra, constant, phase shift for all signals cannot effect the linearity and scale in the Z direction. This conclusion relaxes the stringent condition imposed on the homogeneity of the static magnetic field by the method of U.S. Pat. No. 4,070,611.

What is claimed is:

1. In a method of deriving image information from an object using nuclear magnetic resonance signals the improvement comprising:
    subjecting an object to a continuous static magnetic field along an axis and carrying out a set of sequential steps which comprise:
    (1) inverting selected nuclear spins in a selected plane in the presence of a plane selection gradient of the static magnetic field, the direction of said plane selection gradient being perpendicular to said plane;
    (2) allowing the inverted spins to relax for an interval comparable with their spin-lattice relaxation time;
    (3) exciting said selected nuclear spins in the presence of said plane selection gradient of the static magnetic field;
    (4) rephasing the selected nuclear spins in the selected plane in a direction parallel to the direction of the said plane selection gradient by applying the said plane selection gradient in the reverse direction, applying a phase encoding gradient of the magnetic field having a gradient direction parallel to the selected plane for phase encoding the selected nuclear spins in the direction of the phase encoding gradient, applying a dephasing gradient of the static magnetic field having a gradient direction orthogonal to both the phase selection gradient direction and the phase encoding gradient direction, said rephasing, phase encoding and dephasing gradients all being applied simultaneously;
    (5) removing the said rephasing, phase encoding and dephasing gradients and reading out the resultant free induction signal from the said object in the presence of a read gradient of the magnetic field having a gradient direction which is reverse to the direction of the said dephasing gradient;
    and then successively repeating the above set of sequential steps with different values of time integral of the phase encoding gradient, there being a recovery interval between the repetition of successive sets of steps.

* * * * *